United States Patent
Martinez-Tovar

(10) Patent No.: US 7,328,657 B2
(45) Date of Patent: Feb. 12, 2008

(54) TUBULAR IGNITER BRIDGE

(75) Inventor: Bernardo Martinez-Tovar, Albuquerque, NM (US)

(73) Assignee: SCB Technologies, Inc., Albuquerque, NM (US)

( * ) Notice: Subject to any disclaimer, the term of this patent is extended or adjusted under 35 U.S.C. 154(b) by 315 days.

(21) Appl. No.: 10/488,063

(22) PCT Filed: Aug. 27, 2002

(86) PCT No.: PCT/US02/27415

§ 371 (c)(1),
(2), (4) Date: Aug. 23, 2004

(87) PCT Pub. No.: WO03/021181

PCT Pub. Date: Mar. 13, 2003

(65) Prior Publication Data

US 2004/0261645 A1  Dec. 30, 2004

Related U.S. Application Data

(60) Provisional application No. 60/315,578, filed on Aug. 28, 2001.

(51) Int. Cl.
F42B 3/13 (2006.01)
F42C 19/00 (2006.01)

(52) U.S. Cl. ............... 102/202.9; 102/202.5; 102/202.8

(58) Field of Classification Search ........... 102/200, 102/202.5, 202.6, 202.7, 202.8, 202.9, 202.14
See application file for complete search history.

(56) References Cited

U.S. PATENT DOCUMENTS

| 2,972,951 | A | 2/1961 | Stresau .................. 102/70.2 |
| 3,211,096 | A | 10/1965 | Forney et al. ............ 102/28 |
| 4,708,060 | A | 11/1987 | Bickes, Jr. et al. ...... 102/202.7 |
| 4,831,933 | A | 5/1989 | Nerheim et al. ......... 102/202.5 |
| 4,976,200 | A | 12/1990 | Benson et al. .......... 102/202.7 |
| 5,085,146 | A | 2/1992 | Baginski ................. 102/202.5 |
| 5,094,167 | A | 3/1992 | Hendley, Jr. ............ 102/218 |
| 5,113,764 | A | 5/1992 | Mandigo et al. ........ 102/202.9 |
| 5,179,248 | A | 1/1993 | Hartman et al. ........ 102/202.4 |
| 5,370,054 | A | 12/1994 | Reams et al. ........... 102/202.5 |
| 5,385,097 | A | 1/1995 | Hruska et al. .......... 102/202.5 |
| 5,434,741 | A | 7/1995 | Mulkins et al. ......... 361/253 |
| 5,682,008 | A | 10/1997 | Chervinsky et al. .... 102/202.7 |
| 5,798,475 | A | 8/1998 | Reynes et al. .......... 102/202.5 |
| 5,992,326 | A | 11/1999 | Martinez-Tovar et al. ................. 102/202.4 |
| 6,105,503 | A | 8/2000 | Baginski ................. 102/202.5 |
| 6,192,802 | B1 | 2/2001 | Baginski ................. 102/202.5 |
| 6,199,484 | B1 | 3/2001 | Martinez-Tovar et al. ................. 102/202.4 |

Primary Examiner—James S Bergin
(74) Attorney, Agent, or Firm—Cantor Colburn LLP

(57) ABSTRACT

This invention relates to a solid-state or integrated circuit-type igniter die (10) having a bridge (18) that is formed on a non-planar surface of a substrate (12), and which therefore has a non-planar configuration. Igniter die (10), according to this invention therefore has a three-dimensional configuration and, preferably, a configuration that can enclose a reactive material (26) therein. In a typical embodiment, the bridge (18) of an igniter element of this invention has a tubular configuration. Reactive material (26) is disposed within the interior of the tube (14) and a charge of electric current is flowed through the tube (14) from o the other to form a plasma that initiates the remaining reactive material (26).

8 Claims, 7 Drawing Sheets

TUBULAR IGNITER BRIDGE

CROSS-REFERENCE TO RELATED APPLICATION

This application claims the benefit of U.S. provisional application 60/315,578, filed Aug. 28, 2001 in the name of Bemardo Martinez-Tovar and entitled "Tubular Semiconductor Bridge", and of Patent Cooperation Treaty International Application PCT/US02/27415, published on 13 Mar. 2003 under Publication Number WO 03/021181 and entitled "Tubular Igniter Bridge", this application being the national stage filing of the aforesaid PCT International Application.

BACKGROUND OF THE INVENTION

1. Field of the Invention

This invention relates to igniter elements and, in particular, to igniter dies formed using solid state manufacturing technology to provide igniter bridges on substrates.

Igniter dies find use in the initiation of reactive materials, i.e., pyrotechnic materials and/or explosive materials. Such igniter dies comprise a bridge of conducting or semi-conducting material disposed on a relatively non-conducting substrate. Typically, the bridge is configured as a rectangular solid with its smallest dimension being its height from the surface of the substrate. Larger pads of the bridge material are formed at the ends of the bridge to support electrical contacts for receiving electric current. In use, such dies are incorporated into initiation devices that also comprise a reactive material, i.e., a pyrotechnic and/or explosive material. The reactive material is pressed against the bridge and a small charge of electric current is passed from one pad to the other through the bridge, which vaporizes and initiates the reactive material. This initiation process is useful in various devices, e.g., squibs, detonators, rocket motors, etc.

In prior art igniter dies, the bridge and pads are formed on a planar substrate, i.e., one having a flat top surface, and so have a planar configuration.

2. Related Art

U.S. Pat. No. 6,105,503 to Baginski entitled "Electro-Explosive Device With Shaped Primary Charge", dated Aug. 22, 2000, which is incorporated herein by reference as background material, discloses an electro-explosive device. The device comprises a silicon substrate (31) (FIG. 2) having, on the bottom layer, an electrical contact (33). On the top layer, a second electrical contact (38) is insulated from the substrate by a dielectric layer (34) except in the region where a cup-shaped bridge portion (37, 38) of the electrical contact lines a cavity (36) formed in the substrate. Reactive material is disposed in the cavity. By applying a potential from one contact to the other, current flow can be induced through the bridge portion and the substrate, and ohmic heating of the bridge portion of the top contact causes it to initiate the reactive material therein. The interface between the metallic bridge element and the silicon substrate defines a Schottky diode disposed in series between the electrical contacts.

U.S. Pat. No. 4,708,060 to Bickes, Jr. et al entitled "Semiconductor Bridge (SCB) Igniter", dated Nov. 24, 1987, describes a device comprising a planar formation of semiconductor material (doped silicon 3, FIGS. 1A, 1B) disposed on a flat, non-conducting substrate 8 (sapphire). The semiconductor material is configured to have a thickness of about 1 to 10 micrometers (μm) and to define two large pads 14 joined by a small bridge 2 between them, the bridge having a length of up to about 200 μm. The pads are covered with metallic lands 11 so that electrical conductors can be connected thereto on either side of the semiconductor bridge 2. A reactive material 1 (FIG. 2B) is pressed against the bridge and may be initiated by passing a current through the conductors with sufficient energy to vaporize the bridge. In a specific embodiment, one bridge measured 17 μm long (from pad to pad), 35 μm wide and 2 μm thick, and had a resistivity of $60 \times 10^{-4}$ ohm-cm. Another measured 100×67×4 and had a resistance of 3 ohms. In each of these prior art configurations, the igniter element has a planar configuration.

U.S. Pat. No. 4,976,200 to Benson et al entitled "Tungsten Bridge For the Low Energy Ignition of Explosive and Energetic Materials", dated Dec. 11, 1990, discloses an ignition element comprising a tungsten bridge deposited on top of an insulating silicon bridge. The bridge is formed on a flat substrate and has a substantially flat configuration. In use, reactive material is pressed against the tungsten bridge and a small charge of electric current is passed through the bridge, which forms a plasma that initiates the reactive material.

U.S. Pat. No. 4,831,933 to Nerheim et al entitled "Integrated Silicon Bridge Detonator", dated May 23, 1989, discloses an integrated circuit chip having a silicon substrate on which is formed a polysilicon bridge to which electrical contacts are connected. A glass tube is bonded to the substrate over the bridge and reactive material is packed in the bore of the tube and is thus guided into contact with the semiconductor bridge.

SUMMARY OF THE INVENTION

The present invention provides an igniter die comprising an open-ended tubular bridge of material extending through a substrate, and electrical contacts disposed on the substrate and connected to each end of the bridge.

According to one aspect of the invention, the bridge may comprise a semiconductor material. Optionally, the bridge and the electrical contacts may be insulated from the substrate.

According to another aspect of the invention, the substrate may comprise a semiconductor material and the bridge may be insulated from the substrate semiconductor material. The substrate may have a first and a second surface and may comprise regions of complementary doping at the first and second surfaces relative to the center of the substrate to define a pair of back-to-back diodes across the substrate in parallel with the bridge to protect the bridge against electrostatic discharge. The electrical contacts may be in contact with the substrate at the regions of complementary doping as well as with the ends of the bridge.

According to still another aspect of the invention, at least one surface of the substrate may define a microcavity about at least one end of the bridge.

This invention also relates to a multi-bridge igniter die comprising at least two igniter bridges extending through a substrate, each bridge having two ends, and an electrical contact connected to each end of each bridge. A linking electrical contact interconnects one end of each of the two bridges. There are also terminal electrical contacts at the other ends of the bridges.

Optionally, the substrate of this embodiment may comprise a wafer of semiconductor material and the bridges are insulated from the substrate semiconductor material. The substrate semiconductor material may have a first surface and a second surface and may comprise isolated regions of complementary doping on the first surface relative to the center of the wafer to define a pair of diodes therebetween. The terminal electrical contacts may be in contact with the substrate at the regions of complementary doping as well as with the bridges, whereby the two diodes are disposed in parallel across the end contacts with the two bridges.

This invention also provides a method for forming an igniter die, the method comprising perforating a substrate having a first surface and a second surface, forming an open-ended tubular bridge of material in the perforation, and forming on the substrate an electrical contact connected to each end of the bridge.

Optionally, the method may comprise insulating the bridge and the electrical contact from the substrate. For example, the substrate may comprise a semiconductor material and the method may comprise insulating the bridge from the substrate semiconductor material, forming regions of complementary doping (relative to the center of the substrate) at the first and second surfaces of the substrate to define a pair of diodes across the substrate in parallel with the bridge, and disposing the electrical contacts in contact with the substrate at the regions of complementary doping as well as with the ends of the bridge.

Optionally, this may include forming a cavity about at at least one end of the perforation.

In a particular embodiment, the invention provides a method for forming a multi-bridge die, comprising forming at least two perforations through a substrate, forming a bridge of material in each of at least two perforations, each bridge having two ends, and forming an electrical contact at each end of each bridge, including a linking contact interconnecting one end of each of two bridges and terminal electrical contacts at the other ends of the bridges.

Optionally, the method may comprise forming two diodes in the substrate disposed in parallel across the end contacts with the two bridges.

DETAILED DESCRIPTION OF THE INVENTION AND PREFERRED EMBODIMENTS THEREOF

Figure 1:
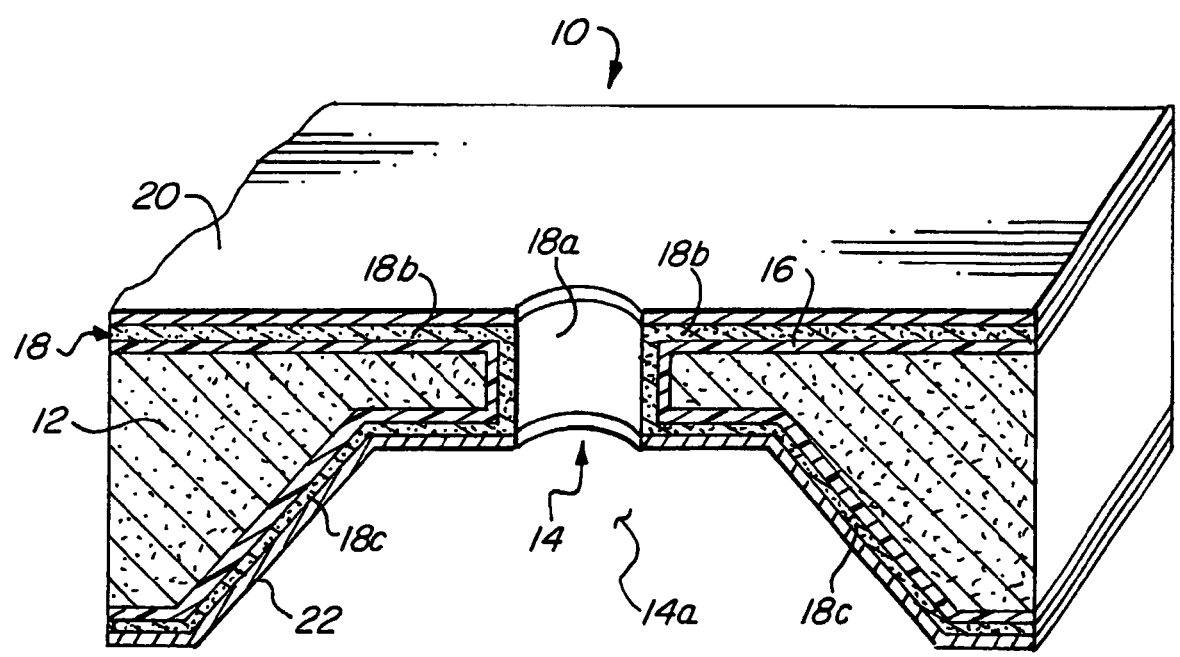
FIG. 1 is a partly cross-sectional perspective view of a tubular semiconductor bridge die according to a particular embodiment of the present invention.

An igniter bridge according to this invention has an open-ended tubular configuration (i.e., open at both ends), and it thus defines a space or volume where a reactive material can be disposed. (For purposes of describing this invention, the term "tubular" is meant to include not only a cylindrical structure, i.e., one having in cross-section, a circular structure that encloses a hollow center, but also a non-cylindrical structure, i.e., one having a non-circular cross-section.) Preferably, metallic electrical contact pads ("electrical contacts") are connected to the bridge at opposite ends thereof. Reactive material can then be disposed within the interior volume of the bridge and a charge of electric current is flowed through the bridge from one end to the other via the electrical contacts to make the bridge release sufficient energy to initiate the reactive material therein.

A bridge may be formed according to this invention by depositing conductive or semiconductive material on the inside surface of a perforation formed in a wafer-like, relatively non-conductive, substrate. The electrical contacts may be formed on the substrate as well, typically at the open ends of the bridge. The material comprising the bridge may extend beyond the ends of the bridge to form contact pads on the substrate, and the electrical contacts may be formed on the contact pads. A reactive material is disposed within the space defined by the igniter element bridge. To initiate the reactive material, a small charge of electric current is passed through the bridge from one end to the other, e.g., via the electrical contacts and the contact pads.

An igniter die comprising an open-ended tubular bridge according to this invention provides a distinct advantage over prior art igniter elements. Specifically, prior art igniter elements (i.e., closed-ended tubular bridges and planar bridges) are subject to failure should the reactive material separate from the bridge or fail to fully engage it. Generally, the charge of reactive material is pressed against the bridge during the process of manufacturing the igniter, but in the case of a closed-ended tubular bridge (like the one shown in U.S. Pat. No. 6,105,503, discussed above), the reactive material tends to form an air pocket at the bottom of the cup-like igniter element, and the air pocket will prevent the material from filling the space therein. Good contact between the bridge and the reactive material is easier to obtain with a planar bridge element, but separation of the reactive material from the bridge can occur as a result of physical handling of the device prior to initiation, thermal cycling, or for other reasons. If these factors cause such separation, the reliability of initiation is drastically diminished.

In contrast to the prior art, the present invention provides a distinct advantage in that reactive material is disposed within a volume defined by the bridge. Once the reactive material is disposed therein, the hollow configuration of the bridge itself inhibits the reactive material from separating from it. An open-ended tubular bridge as provided by this invention, provides a means for air within the bridge to escape from one end while reactive material is introduced into the other end. Thus, the formation of an air pocket within the bridge, which would reduce the contact between the bridge and the material therein, is avoided. Therefore, an initiation device comprising an igniter element according to this invention exhibits much improved reliability with respect to conditions that cause separation of reactive material from igniter elements having planar, or tubular but closed-ended bridge configurations.

An igniter die in accordance with one embodiment of the present invention is shown in FIG. 1 as a tubular semiconductor bridge die 10. Die 10 comprises a substrate 12 in which a perforation 14 has been formed. Perforation 14 opens to a concave microcavity 14a on the bottom of substrate 12. Several layers of material have been deposited on substrate 12, including a silicon oxide layer 16 that covers the top and the bottom of substrate 12 as well as the interior of perforation 14. On top of silicon oxide layer 16 there is a layer 18 comprising polysilicon, which also covers the top and bottom of substrate 12 as well as the interior of perforation 14, where it constitutes a tubular bridge 18a that is open at both ends. The polysilicon of layer 18 has been doped so that it forms a semiconductor material. The regions of layer 18 on the top and bottom surfaces of substrate 12, which are contiguous with the tubular bridge, provide contact pads 18b and 18c connected to the ends of bridge 18a. Finally, metal layers comprising electrical contacts 20 and 22 are formed on contact pads 18b and 18c on the top and bottom of substrate 12 (including within microcavity 14a) and extend up to the ends of the bridge 18, but not in the interior thereof. Polysilicon layer 18 and the contact pads 18b and 18c thereon are electrically insulated from the substrate by silicon oxide layer 16. Conductors that supply the electric current for firing the device can easily be connected to the electrical contacts. When a voltage is applied across the top and bottom electrical contacts 20 and 22, the current can flow through the bridge 18 within perforation 14, which causes it to release energy (e.g., by forming a plasma) and thus initiate a reactive material therein. Due to the insulating effect of layer 16 in this embodiment, the electrical properties of substrate 12 play no part in the operation of the igniter element. Contact pads 18b and 18c, and electrical contacts 20 and 22, although disposed on the substrate, are electrically interconnected only via bridge 18a. Therefore, in this embodiment, substrate 12 may comprise a conductive, a semiconductive or nonconductive material.

Figure 2A:
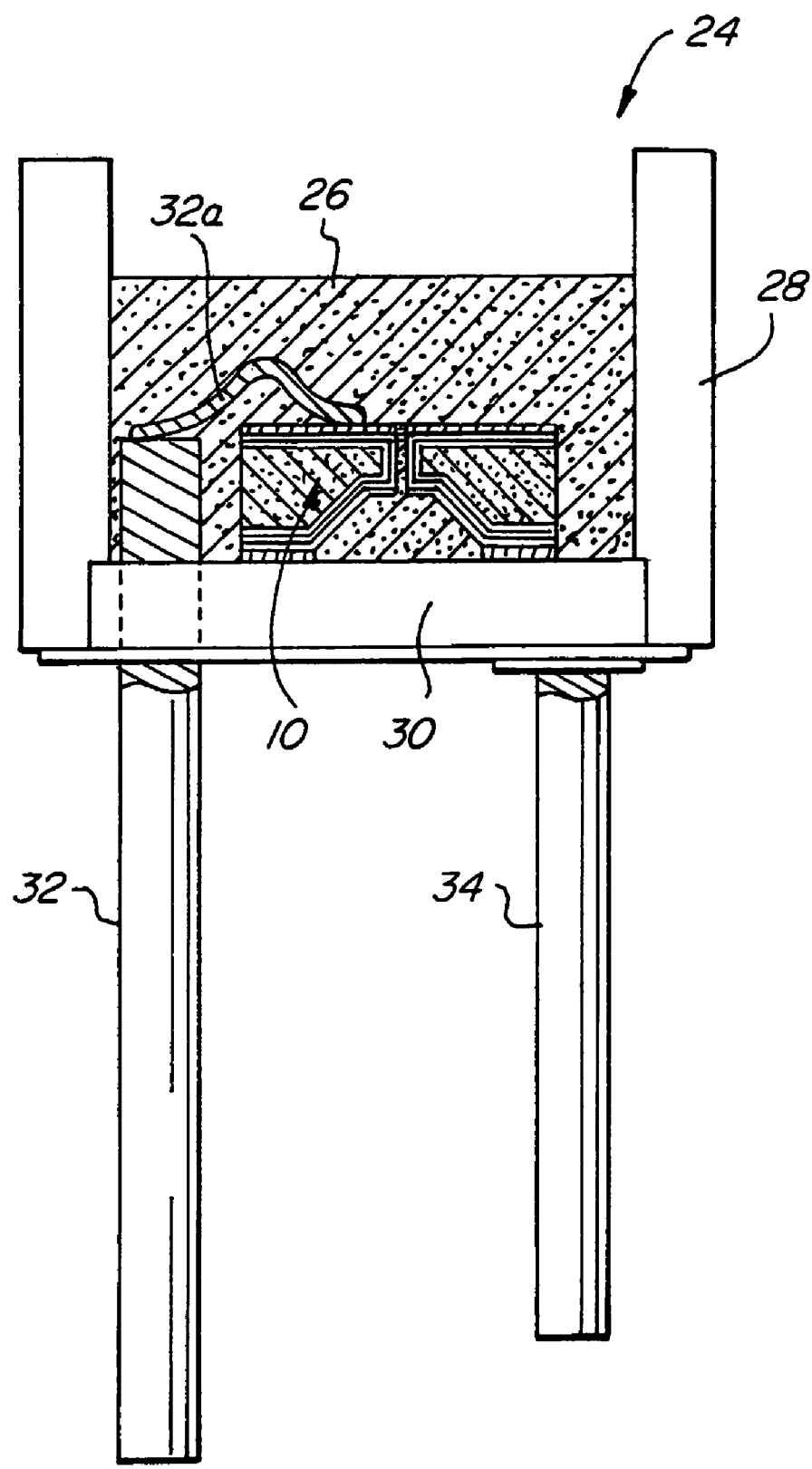
FIG. 2A is a cross-sectional view of an initiation device comprising the tubular semiconductor bridge die of FIG. 1 with the microcavity therein disposed downwards.

One embodiment of an initiation device comprising igniter die 10 is shown in FIG. 2A. As seen in the Figure, initiation device 24 comprises a housing that defines an interior space where reactive material 26 and die 10 are disposed. The housing comprises a short cylinder or "ferrule" 28 and a base 30 on which the ferrule 28 is mounted. Die 10 is situated on base 30 with reactive material 26 surrounding it and disposed within perforation 14 (FIG. 1). A first electrical lead 32 passes through base 30 and is electrically connected to the top surface of die 10 via a jumper 32a. A second lead 34 also passes through base 30 and is electrically connected to the metal layer on the bottom of die 10. A small charge of electric current passed from lead 32 to lead 34 causes the cylindrical semiconductor bridge in die 10 to initiate the reactive material 26 therein. Upon initiation of the reactive material in the bridge, gas pressure quickly builds up in the perforation and in the microcavity beneath it, forcing the remaining reaction upward into a jet-like output, thus providing a mini-thruster effect. Any further reactive material disposed against the die 10 will then be initiated. The cumulative output of the reactive material can be used to initiate various kinds of devices, as will be understood by one of ordinary skill in the art.

Figure 2B:
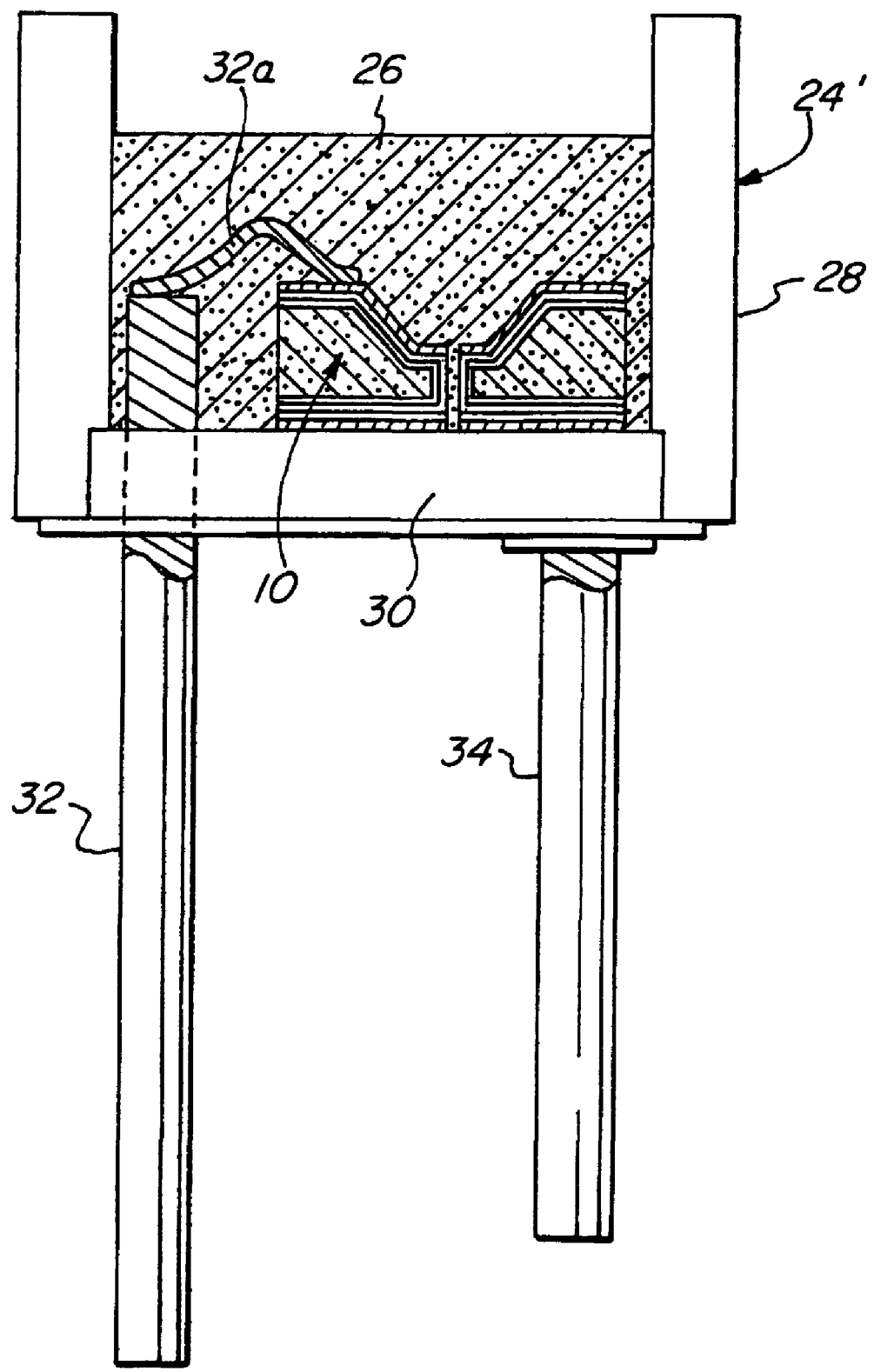
FIG. 2B is a view similar to FIG. 2A of an initiation device in which the die is disposed with the microcavity upwards.

It will also be understood that the vertical orientation of die 10 shown in FIG. 2A can be reversed so that the flat surface is disposed downward and the concave surface faces upward, as shown in FIG. 2B. In such case, the concave microcavity 14a may be employed to receive a charge of reactive material and funnel it into the perforation 14. Even facing upward, the microcavity may serve, by virtue of its shape, to concentrate the output of the material in the perforation upon initiation. Igniter elements of this invention may thus find utility as mini-thrusters in either orientation.

If two igniter dies like die 10 are placed on the same conductive base in either orientation, two ends of the bridges will be electrically interconnected in series by their electrical contacts and the base, and the elements can then be connected to associated control circuitry using surface mount technology and wire bonding techniques.

Figure 3A:
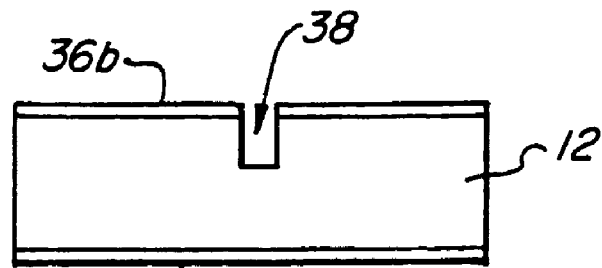
FIGS. 3A through 3D are schematic cross-sectional views of various stages of manufacture of an igniter bridge die according to a particular process embodiment of the present invention.

One process for fabricating an igniter die in accordance with the present invention starts with a silicon wafer substrate that is preferably doped with p-type impurities and that has a (100) crystalline orientation. The silicon substrate is polished on at least one side, preferably both sides and has a thickness of about 500 micrometers. The substrate is typically generally circular but has at least one, preferably two, segments removed, leaving at least one flat edge, preferably two perpendicular flat edges. The substrate is coated with a photoresist and a mask is then applied to define the openings of pores to be formed therein as precursors to perforations in the substrate. The unmasked photoresist is exposed to an ultraviolet light source, developed and then rinsed away to expose the pore openings. The patterned substrate is subjected to a deep reactive ion etching environment to form pores in the substrate at openings in the remaining photoresist. Referring now to FIG. 3A, at this point in the process the substrate 12 has an intact bottom layer of photoresist 36a and a perforated top layer of photoresist 36b and a plurality of pores 38 that extend through the top layer of photoresist 36b and into the substrate 12.

After the initial formation of the pores as shown in FIG. 3A, the photoresist 36a and 36b are stripped from the top and bottom of the substrate, and low pressure chemical vapor deposition is employed to deposit a low-stress-type of silicon nitride on the substrate. The silicon nitride film should be free of pinholes or other defects greater than one micrometer in diameter.

Figure 3B:
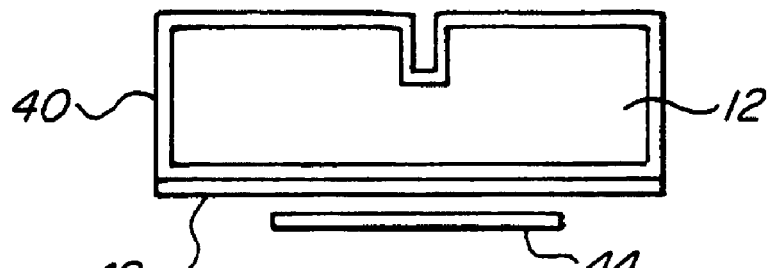
Figure 3C:
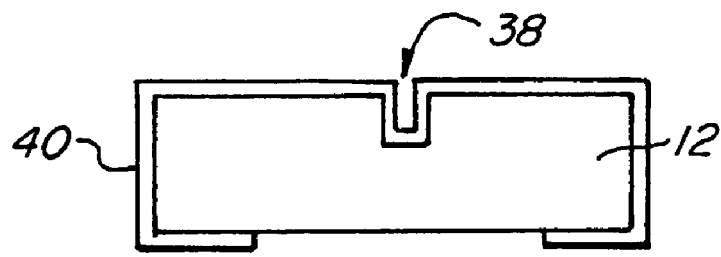

The next few steps of the procedure serve to etch away part of the substrate from the bottom surface to a depth sufficient to open the closed ends of the pores so that the pores then perforate the substrate. To accomplish this, a registration map of the pores is imprinted on the bottom of the substrate to insure good alignment of the microcavities and the pores. A photoresist coating 42 is applied to the silicon nitride 40 on the bottom of the substrate and an array of masks 44 is applied to the bottom surface to define openings for microcavities that will be aligned with the pores, as suggested in FIG. 3B. The unmasked photoresist is developed and then the remaining undeveloped photoresist is rinsed away, exposing areas of silicon nitride where the masks had been, opposite from the perforations. The substrate is then exposed to a plasma etching environment containing $CF_4$ and $O_2$ to perforate the substrate through the holes in the photoresist, and the photoresist is then stripped, leaving the perforations in the silicon nitride layer 40 opposite the pores 38 as shown in FIG. 3C. The microcavities are then etched into the substrate 12 opposite the pores 38 so that the pores open to the bottom of the substrate. This may be done by subjecting the substrate to chemical etching using a potassium hydroxide solution with a concentration in the range of 20 to 50 percent and at a temperature of 45° C. to 90° C. until bottoms of the pores are opened and thus perforate the substrate and provide microcavities about the pores. This step is controlled so that etching is achieved to within about five micrometers of the targeted depth.

Figure 3D:
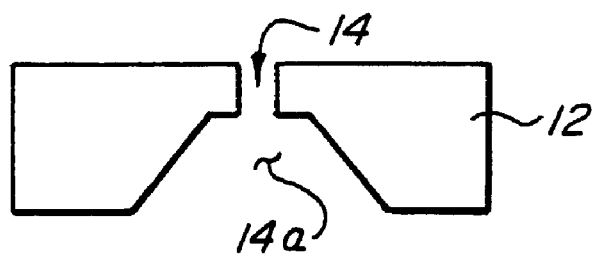

Once the microcavities 14a are formed to a depth sufficient to open the pores, the silicon nitride layer is stripped from the substrate, leaving perforations, such as perforation 14, in the substrate as shown in FIG. 3D. The substrate is then subjected to oxidizing conditions to form an oxide layer thereon having a thickness in the range of about 0.4 to 1 micrometer. A low-pressure chemical vapor deposition is then used to deposit a layer of polysilicon on the substrate to a thickness in the range of about 0.5 to 2 micrometers, including a tube-shaped layer (the bridge 18a, FIG. 1) inside perforation 14 and contact pad regions (18b and 18c, FIG. 1) extending from the ends of the bridge on the top and bottom surfaces of the substrate. The polysilicon is then doped using standard chemical vapor deposition (CVD) techniques, e.g., the thermal diffusion of phosphorus. The level of doping is controlled and coordinated with other characteristics of the resulting cylindrical tubular polysilicon bridge (i.e., the length L, thickness t, diameter $D(=2*R_2)$) to achieve the desired electrical resistance, which is typically in the range of one to ten ohms. (The microcavity may be formed about the perforation to reduce the thickness of the substrate, and thus reduce L so that the desired resistance R can be achieved using preferred CVD parameters. The resistance R of the tubular bridge can be estimated as $$R=(R_s/\pi)\,[L/((2*R_2)-t)]$$

where $R_s$=the sheet resistance, which is the resistivity divided by t; L=the length of the tube; $R_2$=the outer radius of the tube; and t=the thickness of the tube. A layer of electrically-conductive metal such as aluminum, gold, titanium, etc., is deposited on the top surface of the contact pad regions of the polysilicon layer adjacent the ends of the bridge by a line-of-sight deposition technique such as thermal evaporation and sputtering, to avoid deposition inside of the perforation, i.e., on the bridge. Metal is also applied to the bottom surface of the substrate, including within the microcavity but, again, not within the perforation, yielding igniter elements as shown in FIG. 1. The substrate is then saw-diced into separate dies (igniter elements) and attached to chip carriers in any suitable manner. For example, the dies may be secured to the carriers by conductive epoxy, solder, eutectic bonding, etc. The die top surface may be electrically connected to the carrier by ultrasonic welding of a jumper thereto.

The igniter die is then subjected to low-temperature thermal cycling to chemically adhere the metal layer to the doped polysilicon layer if the metal is compatible with such annealing temperatures (such annealing should be avoided when the metal is gold, tungsten, copper, etc.).

Figure 4:
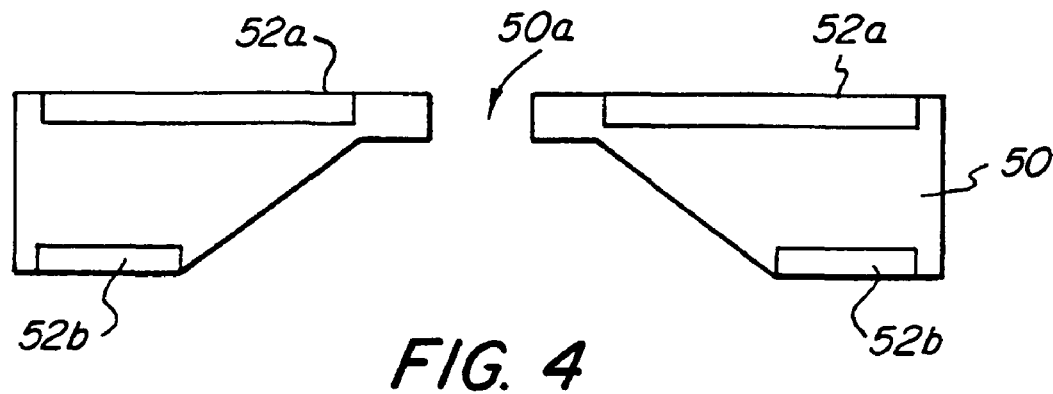
FIG. 4 is a schematic cross-sectional view of a semiconductor substrate having diode regions doped therein according to one embodiment of the present invention.
Figure 5:
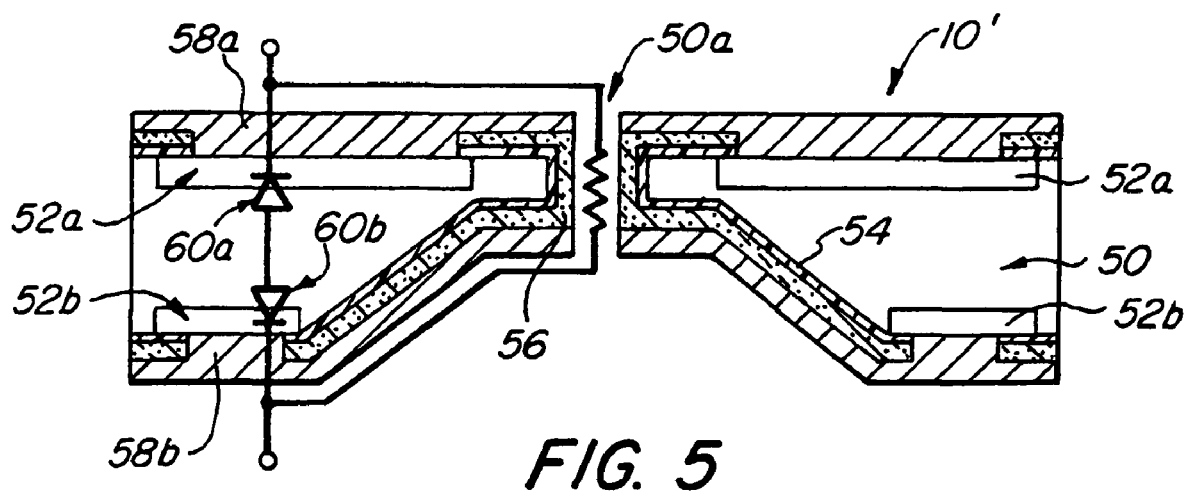
FIG. 5 is a schematic cross-sectional view of a tubular semiconductor bridge die formed from the substrate of FIG. 4.

In alternative embodiments, the bridge material may comprise any material that can be deposited in the perforations via chemical vapor deposition, e.g., polysilicon, tungsten, copper, etc. It will be apparent to one of ordinary skill in the art that the foregoing process can easily be adapted to include a zener diode on the igniter element to desensitize the bridge element to electrostatic discharges. To accomplish this, a semiconductor substrate is masked and doped with a complementary-type ion (relative to the dopant of the substrate) on the top and bottom surfaces of the substrate in regions about the positions for the perforations. Typically, a perforated substrate, which may optionally have microcavities formed therein as shown in FIG. 3D, is masked and subjected to a doping process to introduce the complementary dopant in the top and bottom surfaces of the substrate. In a typical embodiment, illustrated in FIG. 4, a substrate 50 comprising a p-type semiconductor material will have regions 52a, 52b on the top and bottom surfaces thereof that have been doped to constitute n-type semiconductor material about the perforation 50a. Thus, regions 52a, 52b at the top and bottom surfaces of the substrate 50 have a doping that is complementary (i.e., opposite) to the doping of the center of the substrate 50. It will be understood by one of ordinary skill in the art that the interfaces between the n-type and p-type regions will define diodes so that, as sensed from the top to the bottom surface across the regions of complementary doping, the substrate 50 will define back-to-back diodes therein. Once the perforation and diode regions have been formed, further deposition steps are carried out to provide an insulation layer 54, the bridge material 56 and metal contacts 58a, 58b as shown in semiconductor bridge die 10' of FIG. 5. In this case, however, the metal contact not only connects to the contact pad regions of the bridge material at the ends of the bridge, it also extends to the complementary doped regions 52a, 52b on the surface of the substrate 50 about the perforation. In FIG. 5, die 10' is depicted with an overlay of a circuit diagram illustrating that the contacts are electrically interconnected not only by the semiconductor bridge (which is represented as a resistor) but also by the back-to-back diodes disposed in parallel therewith.

The doping in the substrate 50 can be controlled so that the diodes 60a, 60b formed therein have a breakdown voltage sufficient to prevent a normal firing current from flowing therethrough. In other words, the breakdown voltage be greater than the voltage of the normal firing signal. In one particular embodiment, for example, a diode breakdown voltage of 10 volts will be adequate when a normal operating signal for the SCB has a potential of 6 volts across the bridge. In such case, the normal operating signal will not exceed the diode breakdown voltage, so current will flow through the bridge and will not be diverted as a discharge through the diodes in the substrate. However, should an extraordinary voltage potential be generated across the contacts, e.g., as a result of an inadvertent electrostatic discharge, such a voltage can exceed the breakdown threshold for the diodes so that the current flow associated therewith can be discharged through the substrate rather than through the semiconductor bridge. Thus, an inadvertent initiation of reactive material in the bridge will be avoided.

In general, the breakdown voltage of the diode(s) is always higher than the potential of the normal operating signal, preferably 25 percent higher or more, and in various embodiments the breakdown voltage may be two to three times the firing voltage, depending on the type of electrostatic discharge that is expected. However, optionally, the voltage of the normal operating signal and the breakdown voltage can be in the range of 6 to 10 volts.

Figure 6:
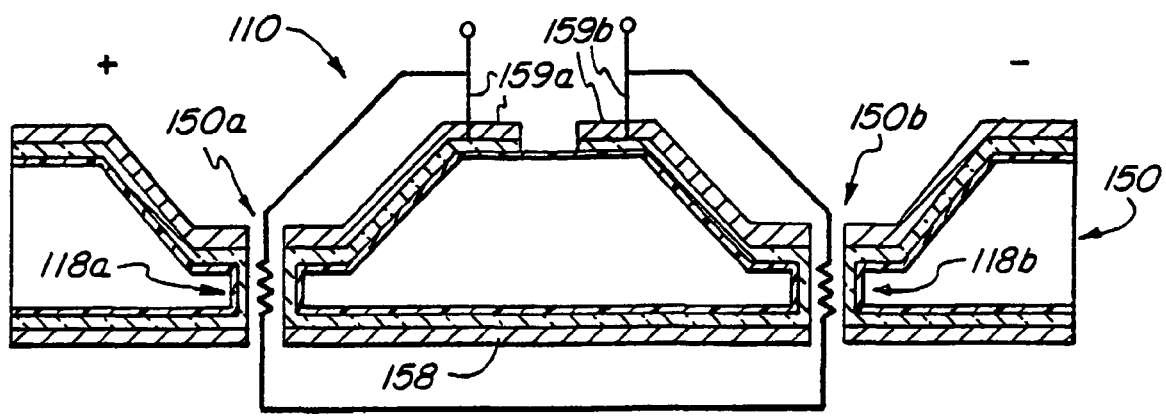
FIG. 6 is a schematic cross-sectional view of a particular embodiment of a dual semiconductor bridge die according to the present invention.

When an igniter die comprises more than one bridge, the electrical contacts for two adjacent bridges can be interconnected on one side of the substrate, thus making it possible to dispose the two bridges in series in a firing circuit having electrical contacts on the same side of the substrate. One such embodiment is illustrated in FIG. 6, in which a circuit diagram representing the device is superimposed on the drawing. As shown in this Figure, the dual bridge igniter die 110 comprises two optionally tubular SCBs 118a, 118b that have a common electrical contact 158 on the bottom surface of the substrate. Input leads for delivering an electrical initiation signal can be connected to the device at the first and second contacts 159*a*, 159*b* disposed about the perforations 150*a*, 150*b* on the top surface of the substrate 150. This disposes the two SCBs 118*a*, 118*b* in series between the input leads. Preferably, die 110 is mounted on a nonconductive base. In an alternative embodiment, there may be two mutually isolated electrical contacts at the bottom of the substrate. In such case, a conductive base can be provided to electrically interconnect the electrical contacts.

Figure 7:
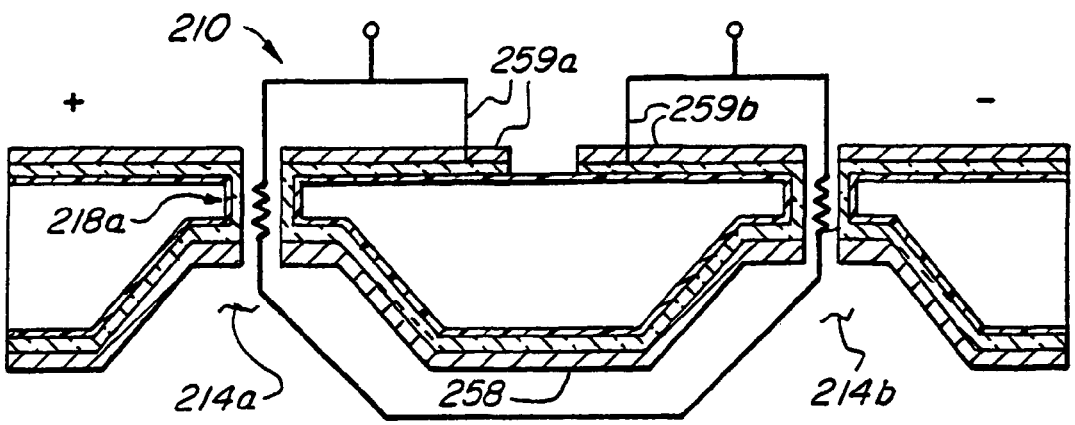
FIG. 7 is a schematic cross-sectional view of a dual semiconductor bridge die according to another embodiment of the present invention.

In another alternative embodiment of this invention, a multiple SCB die can be configured to have the microcavities facing downward as shown in FIG. 7. The dual bridge die 210 of FIG. 7 has an electrical contact 258 common to both SCBs 218*a*, 218*b* extending from within one microcavity 214*a* to the adjacent microcavity 214*b*. The contacts 259*a*, 259*b* on the top surface of the igniter element are electrically isolated from each other and each is associated only with a single respective SCB.

Figure 8:
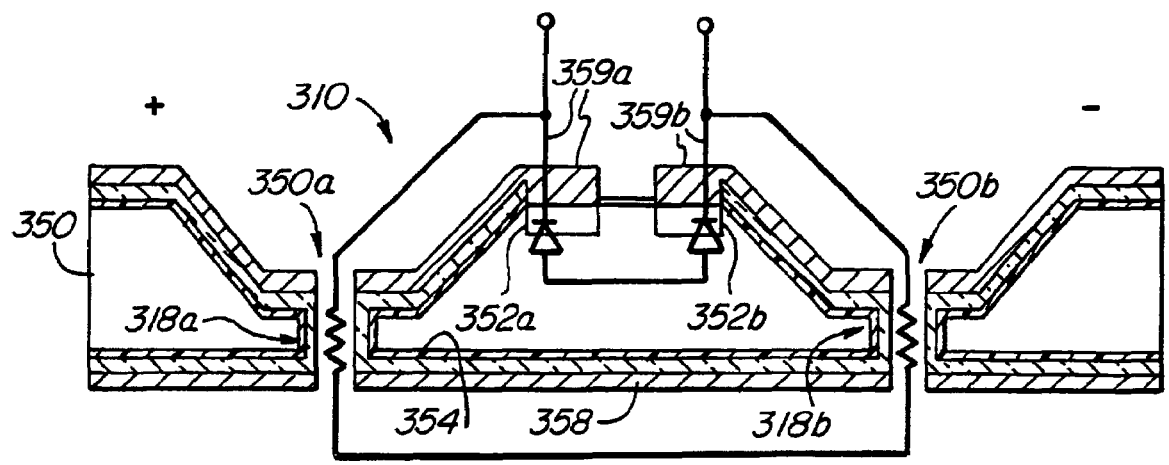
FIG. 8 is a schematic cross-sectional view of a dual semiconductor bridge die with diodes formed therein according to a particular embodiment of the present invention.
Figure 9:
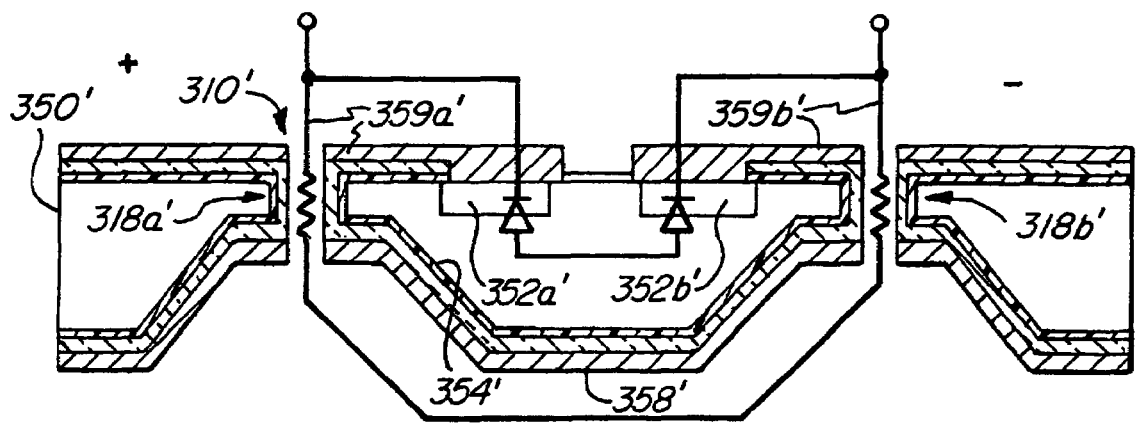
FIG. 9 is a schematic cross-sectional view of a dual semiconductor bridge die with diodes formed therein according to another embodiment of the present invention.

Multiple SCB dies as shown in FIGS. 6 and 7 may optionally be adapted to incorporate the back-to-back diode voltage protection described with reference to FIG. 5. In such case, two diodes are formed back-to-back on the same side of the substrate, between the mutually isolated electrical contacts. FIG. 8 provides a schematic cross section of such a dual semiconductor bridge die 310 having microcavities disposed upward and a schematic overlay of the electric circuit that represents it. FIG. 9 shows a similar die 310' having a microcavity disposed downward; otherwise, die 310' is configured in similarity to igniter die 350 (FIG. 8), and like structures bear the same reference numerals except for the addition of a prime mark. To avoid redundancy in the description, only the reference numerals associated with die 310 (FIG. 8) will be included in the following description, but it should be understood that the description applies equally to die 310', except where specific distinctions are mentioned. These devices, like the igniter element die of FIG. 5, may each comprise a substrate having a central region of p-type doping. In die 310, the SCBs 318*a*, 318*b* are interconnected by a common electrical contact 358. An isolated diode region 352*a*, 352*b* of complementary n-type doping is associated with each SCB 318*a*, 318*b* to define a pair of back-to-back diodes between the SCBs. (In die 310' (FIG. 9), the common electrical contact 358' extends from one microcavity to the other and the contacts 359*a'*, 359*b'* are on the flat side of the device.) In these embodiments, however, the circuit path for the diversion of inadvertent high-energy electrical pulses, e.g., static discharges, does not penetrate the substrate from one side to the other but, instead, it travels from one of the contacts, e.g., 359*a'*, to the other 359*b'* along the top surface of the substrate 350'. In addition, the electrical contacts are in direct contact with the diode regions. A layer of silicon dioxide 354' is interposed between the contacts and the diode regions 352*a'*, 352*b'*. The presence of the dielectric layer will not affect the discharge-diverting function of the back-to-back diodes since the breakdown barrier voltage of the dielectric is much higher than the breakdown voltage for the diodes.

The igniter dies of the present invention provide a number of nonobvious advantages relative to the prior art igniter element shown in U.S. Pat. No. 6,105,503 of Baginski (discussed above). The prior art device comprises a semiconductor substrate having a cavity formed therein with an electrical contact on the surface of the substrate. The contact is insulated from the substrate by a dielectric layer except in the region of the cavity, where it constitutes a closed-ended cup-like bridge. A second contact is formed on the opposite surface of the substrate. The interface between the metal contact in the cavity and the substrate defines a Schottky diode between the contacts, i.e., in series with the bridge element. The Schottky diode has a much greater resistance than that of the bridge element, so it is a barrier to testing the integrity of the bridge element because measurement of a resistance across the electrodes will be high regardless of whether there is proper continuity in the device or not. As a result, the device can easily give a false positive. Alternatively, the Baginski device could be tested by applying a voltage higher than the breakdown voltage, but this could be destructive to the device and should not be done in situ because of the possibility of inadvertently initiating a reactive material in contact with the bridge element.

In contrast, various embodiments of the present invention dispose the diode(s) in parallel with the semiconductor bridge. This allows for easier testing of the integrity of the bridge element than does the Baginski device because diodes in parallel with the SCB do not interfere with current flow through the SCB when they are in a non-conductive state.

Furthermore, employing an open-ended bridge allows for a visual inspection of proper placement of reactive material within the hollow bridge. This can be achieved by placing the igniter element on a transparent support surface and viewing the perforation through the support surface. In contrast, the interior of the bridge structure of the Baginski device cannot be observed through the closed end thereof.

Finally, the manufacture of an open-ended tubular igniter bridge as described herein allows for better control of the resistance and firing characteristics of the bridge than does the manufacture of the Baginski device. This is because resistance is a volumetric effect and, by the process described for producing igniter elements in accordance with this invention, the volume of the bridge element is well defined and easily controllable. Devices of a desired resistance value and volume can therefore be predictably and reliably produced. In contrast, the volume of material through which current flows for the operation of the Baginski device is not well defined because it is bounded at the bottom by the entire flat surface of the bottom contact and extends upward to various points on the bottom and sides of a cup-shaped electrode bridge. Such a diffuse current flow region makes it difficult to predict what the resistance of the device will be for a given configuration of the electrode bridge.

Although the invention has been described herein with reference to particular embodiments thereof, it will be understood by one of ordinary skill in the art upon a reading and understanding of this disclosure that various alterations and modifications of the devices and methods described herein will fall within the scope and spirit of this invention.

What is claimed is:

1. An igniter die comprising:
    an open-ended tubular bridge extending through a substrate and opening into an etched-away portion of the substrate, the etched-away portion being disposed at at least one end of the bridge, whereby the tubular bridge is open-ended at both opposite ends thereof; and
    electrical contacts disposed on the substrate and connected to each opposite end of the bridge.

2. The die of claim 1 wherein the bridge comprises a semiconductor material.

3. The die of claim 2 wherein the bridge and the electrical contacts are insulated from the substrate.

4. The die of claim 1, claim 2 or claim 3 wherein the etched-away portion is located on at least one surface of the substrate and about at least one end of the bridge.

5. The igniter die of claim 4 wherein the etched-away portion defines a microcavity defined by smooth walls.

6. The igniter die of claim 5 wherein the etched-away portion defines a microcavity of truncated conical configuration having opposite smaller and larger diameter ends and the tubular bridge opens into the smaller diameter end of the microcavity.

7. The igniter die of claim 1, claim 2 or claim 3 wherein the etched-away portion defines a microcavity defined by smooth walls.

8. The igniter die of claim 7 wherein the etched-away portion defines a microcavity of truncated conical configuration having opposite smaller and larger diameter ends and the tubular bridge opens into the smaller diameter end of the microcavity.

\* \* \* \* \*